(12) United States Patent
Matsumoto et al.

(10) Patent No.: US 8,692,458 B2
(45) Date of Patent: Apr. 8, 2014

(54) LIGHT EMITTING DEVICE AND ELECTRONIC DEVICE

(75) Inventors: Hiroshi Matsumoto, Higashiyamato (JP); Kunihiro Matsuda, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 88 days.

(21) Appl. No.: 13/246,206

(22) Filed: Sep. 27, 2011

(65) Prior Publication Data

US 2012/0074409 A1  Mar. 29, 2012

(30) Foreign Application Priority Data

Sep. 28, 2010 (JP) ................................. 2010-217617

(51) Int. Cl.
*H01L 29/08* (2006.01)
(52) U.S. Cl.
USPC ............... 313/506; 313/505; 257/40; 257/59; 257/72; 257/79; 257/E51.018
(58) Field of Classification Search
USPC .................. 313/505, 506; 257/40, 59, 72, 79, 257/E51.018, E51.003
See application file for complete search history.

(56) References Cited

U.S. PATENT DOCUMENTS

2003/0062524 A1* 4/2003 Kimura .......................... 257/72
2009/0243482 A1* 10/2009 Tohyama et al. ............. 313/505

FOREIGN PATENT DOCUMENTS

| JP | 2001-195012 A | 7/2001 |
| JP | 2003-162254 A | 6/2003 |
| JP | 2007-041571 A | 2/2007 |

OTHER PUBLICATIONS

Japanese Office Action dated Dec. 4, 2012 (and English translation thereof) in counterpart Japanese Application No. 2010-217617.

\* cited by examiner

*Primary Examiner* — Kenneth Parker
*Assistant Examiner* — Jose R Diaz
(74) *Attorney, Agent, or Firm* — Holtz, Holtz, Goodman & Chick

(57) ABSTRACT

A light emitting device includes: a light emitting element including a first electrode, a second electrode opposed to the first electrode, and a light emitting layer provided between the first electrode and the second electrode; a capacitor having a third electrode formed in a position overlapping the light emitting element and an insulating layer provided between the first and third electrodes; a first drive transistor disposed on a first side of the first electrode and having a gate electrode; and a second drive transistor disposed on a second side of the first electrode and having a gate electrode connected to the gate electrode of the first drive transistor via the third electrode.

15 Claims, 16 Drawing Sheets

LIGHT EMITTING DEVICE AND ELECTRONIC DEVICE

CROSS-REFERENCE TO RELATED APPLICATION

This application claims the benefit of Japanese Patent Application No. 2010-217617, filed on Sep. 28, 2010, the entire disclosure of which is incorporated by reference herein.

FIELD

The present invention relates to a light emitting device and an electronic device.

BACKGROUND

An organic EL element has an anode electrode, a cathode electrode, and organic thin film layers (an electron injection layer, a light emission layer, a hole injection layer, and the like) formed between the electrodes. The organic EL element emits light by energy generated by recombination of holes supplied from the hole injection layer and electrons supplied from the electron injection layer, in the light emission layer. The light emission is realized by applying voltage equal to or higher than a predetermined voltage threshold to the organic thin film layers, and the brightness of the light is controlled by the application voltage. As disclosed in Unexamined Japanese Patent Application KOKAI Publication No. 2001-195012, such an organic EL element is used for display devices of various kinds of electronic devices, and is driven by a drive circuit including a TFT (Thin Film Transistor), a capacitor, and the like. The organic EL element is formed together with the drive circuit on a substrate.

The layout of the drive circuit on a substrate is very important. In particular, the larger the area of a capacitor for storing charges of an amount according to the potential difference between a gate and a source of a TFT and holding the potential difference is, the better.

SUMMARY

The present invention has been made in view of the matters described above and has an objective to provide a light emitting device and an electronic device in which the area of capacitors is large.

To achieve the objective, a light emitting device of the present invention is constructed to have the followings:

a light emitting element including a first electrode, a second electrode opposed to the first electrode, and a light emitting layer provided between the first electrode and the second electrode;

a capacitor having a third electrode formed in a position overlapping the light emitting element and an insulating layer provided between the first electrode and the third electrode;

a first drive transistor disposed on a first side of the first electrode and having a gate electrode; and a second drive transistor disposed on a second side of the first electrode and having a gate electrode connected to the gate electrode of the first drive transistor via the third electrode.

BRIEF DESCRIPTION OF THE DRAWINGS

A more complete understanding of this application can be obtained when the following detailed description is considered in conjunction with the following drawings, in which.

DETAILED DESCRIPTION

A best mode embodiment of the present invention will be described below with reference to the accompanying drawings.

Figure 1:
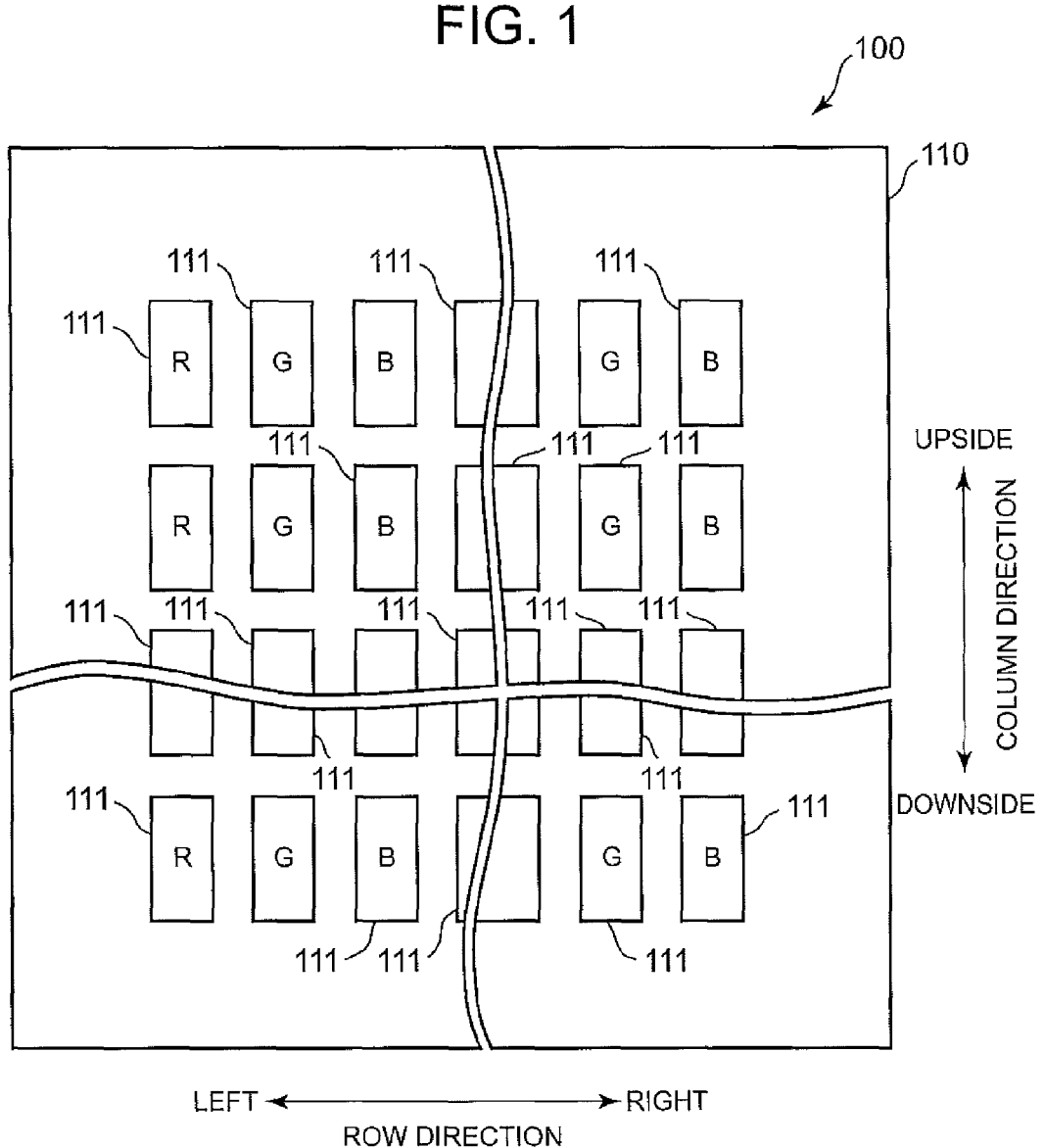
FIG. 1 is a plan view of a light emitting device according to an embodiment of the present invention, seen from a substrate side.

A light emitting device 100 according to the embodiment is, as illustrated in FIG. 1, a display panel having a transparent substrate 110 and a plurality of pixels 111 formed on the substrate 110. The plurality of pixels 111 are arranged in a matrix, and each of them emits light of any of three colors of red (R), green (G), and blue (B). In the embodiment, a plurality of sets each made of three pixels 111 emitting light of red, green, and blue are repetitively arranged in the row direction (horizontal direction) and a plurality of pixels 111 of the same color are arranged in the column direction (vertical direction). Light emitted from the pixels 111 passes through the substrate 110 and goes to the outside of the light emitting device 100. Each of the pixels 111 emits light with predetermined brightness or no light, thereby displaying a predetermined image via the substrate 110.

Figure 2:
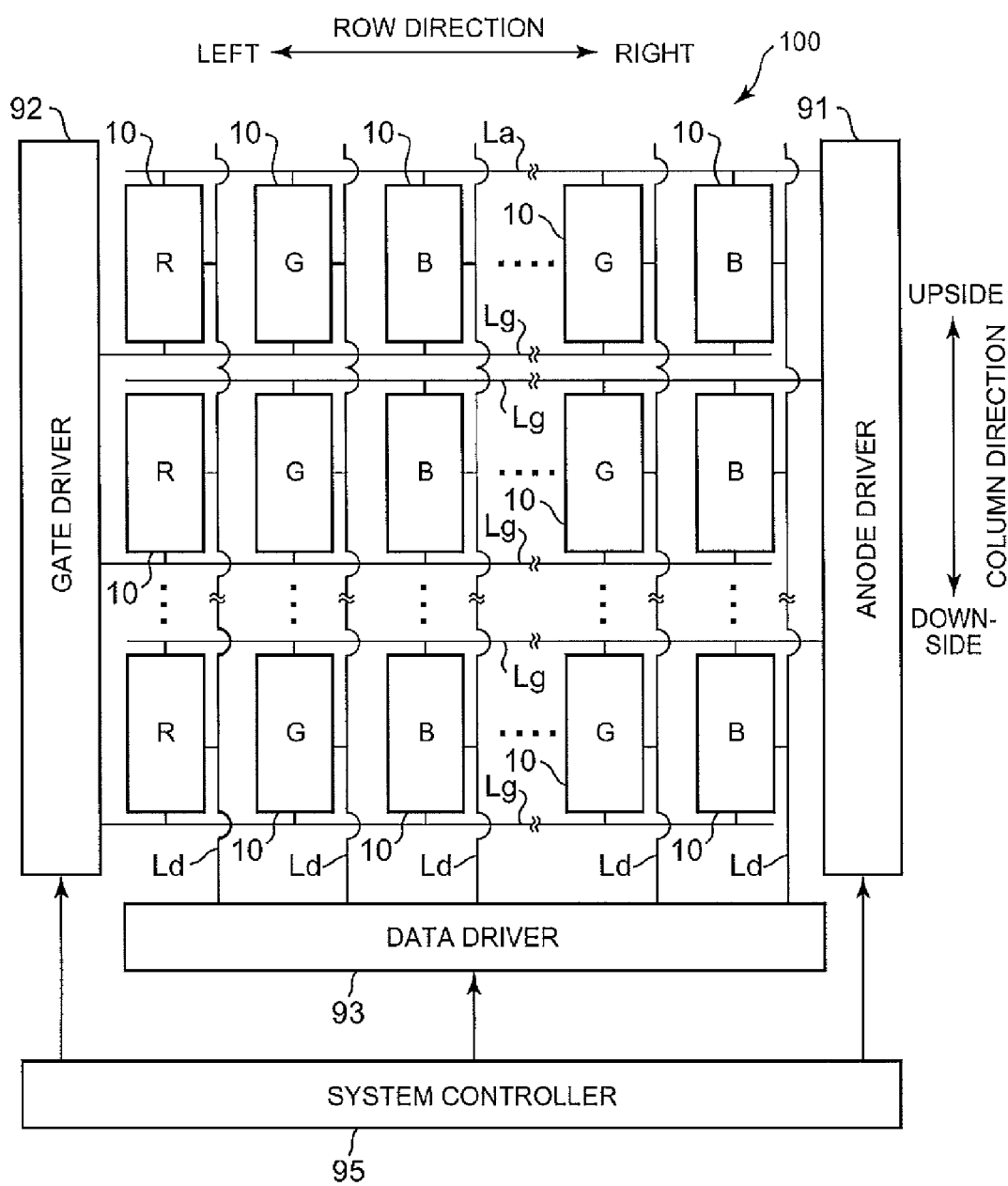
FIG. 2 is a schematic diagram showing an inner circuit configuration of the light emitting device of FIG. 1.

The inside of the light emitting device 100 will be described with reference to FIG. 2. The light emitting device 100 has a plurality of pixel circuits 10 arranged in the row and column directions (that is, arranged in a matrix) and anode lines La, gate lines Lg, and data lines Ld as signal lines connected to the plurality of pixel circuits 10 arranged in the row direction or the column direction. The anode lines La and the gate lines Lg are connected to the plurality of pixel circuits 10 arranged in the row direction. The data lines Ld are connected to the plurality of pixel circuits 10 arranged in the column direction.

Each of the anode lines La is connected to an anode driver 91 via a not-shown connection terminal. Each of the gate lines Lg is connected to a gate driver 92 via a not-shown connection terminal. Each of the data lines Ld is connected to a data driver 93 via a not-shown connection terminal. The anode driver 91, the gate driver 92, and the data driver 93 are controlled by a system controller 95.

The system controller 95 controls the anode driver 91, the gate driver 92, and the data driver 93 on the basis of image data supplied from the outside, thereby controlling light emission/no light emission of each of the pixels 111 of the light emitting device 100 and brightness in the case of emitting light. The control on the drivers is performed by supply of a control signal. As will be specifically described later, the anode driver 91 applies a voltage Va to the anode lines La under control of the system controller 95. The gate driver 92 applies a voltage Vg to the gate lines Lg under control of the system controller 95. The data driver 93 applies a voltage Vd to the data lines Ld under control of the system controller 95.

An apparatus including the light emitting device 100, the anode driver 91, the gate driver 92, the data driver 93, and the system controller 95 is provided, for example, in a display device.

Figure 3:
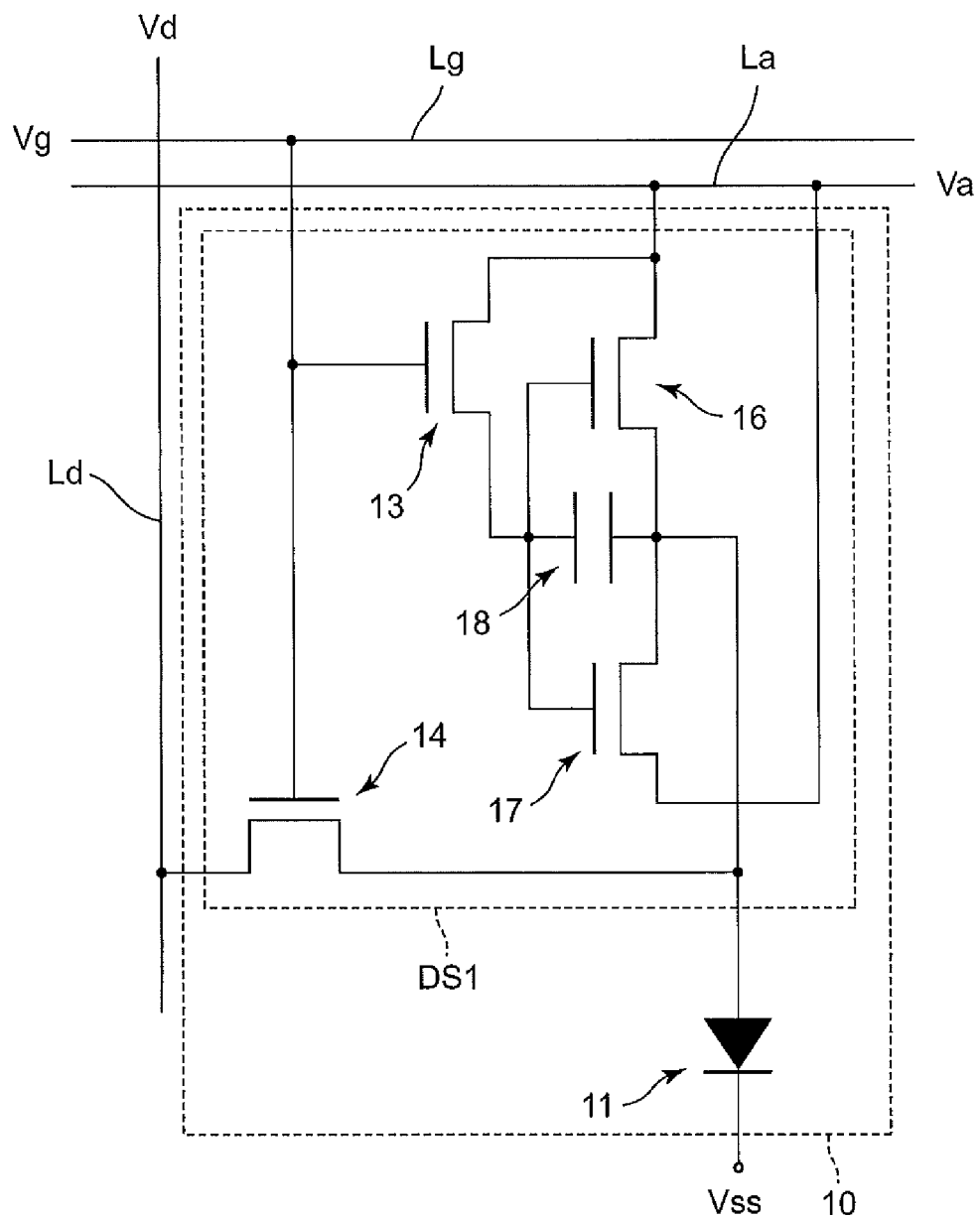
FIG. 3 is a diagram showing a pixel circuit of the light emitting device of FIG. 1.

As illustrated in an equivalent circuit of FIG. 3, the pixel circuit 10 has a light emitting element (organic EL element) 11 and a drive circuit DS1 for actively driving the light emitting element 11. The light emitting element 11 emits light of any of red, green, and blue and corresponds to the pixel 111. By arranging the pixel circuits 10 in a matrix as shown in FIG. 2, the pixels 111 are arranged in a matrix as illustrated in FIG. 1.

The drive circuit DS1 has a first selection transistor 13, a second selection transistor 14, a first drive transistor 16, a second drive transistor 17, and a capacitor 18.

With regard to the first selection transistor 13, the gate electrode is connected to the gate line Lg, one of the source electrode and the drain electrode is connected to the anode line La, and the other one of the source electrode and the drain electrode is connected to the gate electrode of the first drive transistor 16 and the gate electrode of the second drive transistor 17. With regard to the second selection transistor 14, the gate electrode is connected to the gate line Lg, one of the source electrode and the drain electrode is connected to the data line Ld, and the other one of the source electrode and the drain electrode is connected to the anode (a first electrode 11a) of the light emitting element 11. With regard to the first drive transistor 16, the gate electrode is connected to the source electrode of the first selection transistor 13, the drain electrode is connected to the anode line La and the drain electrode of the first selection transistor 13, and the source electrode is connected to the anode of the light emitting element 11 and the source electrode of the second selection transistor 17. With regard to the second drive transistor 17, the gate electrode is connected to the source electrode of the first selection transistor 13, the drain electrode is connected to the anode line La, and the source electrode is connected to the anode of the light emitting element 11 and the source electrode of the first selection transistor 16. Two opposed electrodes of the capacitor 18 are connected to the gate and source electrodes of the first drive transistor 16 and also connected to the gate and source electrodes of the second drive transistor 17. The cathode of the light emitting element 11 is connected to reference potential Vss (for example, GND (ground)).

Figure 4:
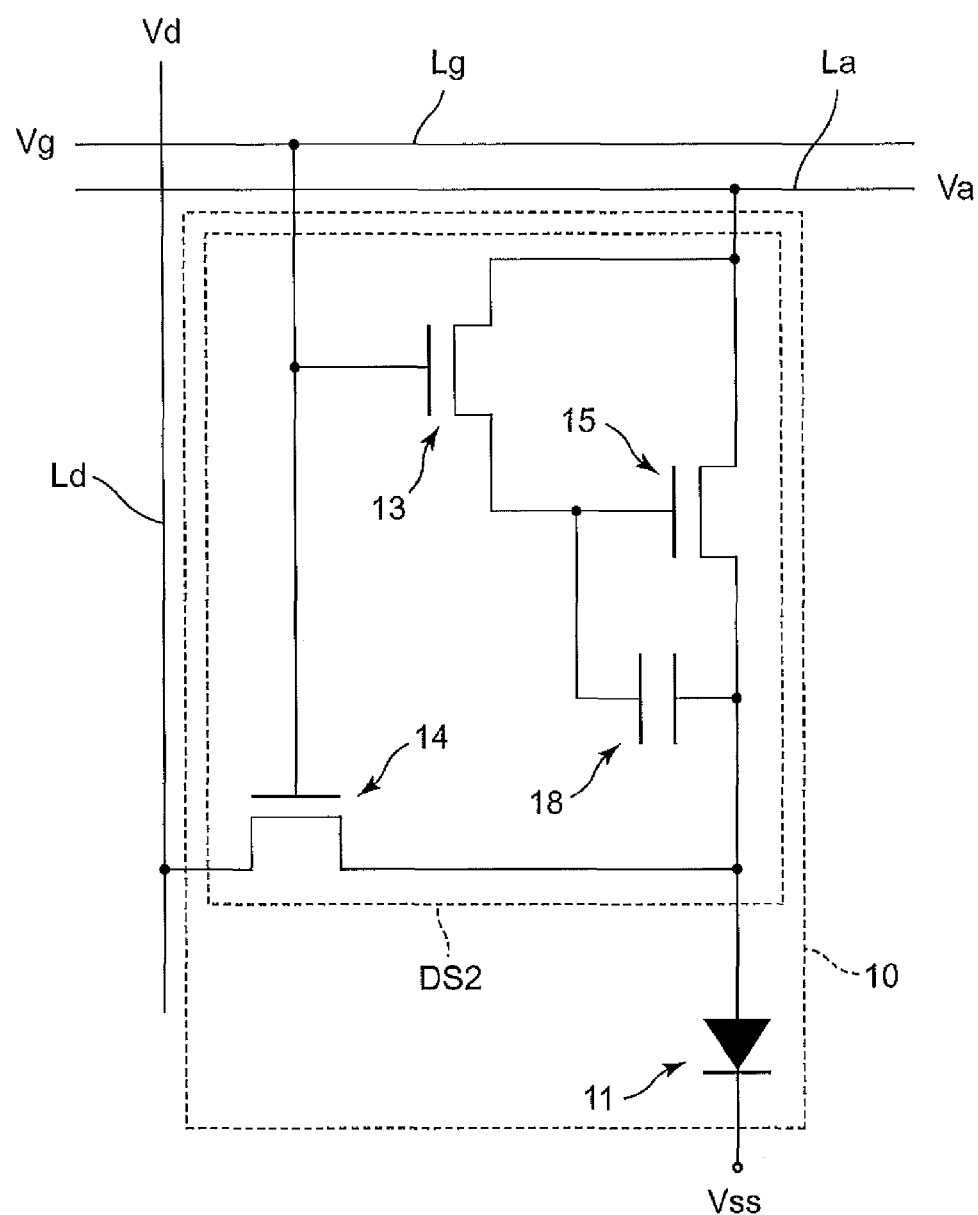
FIG. 4 is an equivalent circuit diagram of the pixel circuit of FIG. 3.

In the first and second drive transistors 16 and 17, the gate electrodes are connected to each other, and the source electrodes are connected to each other, and the drain electrodes are connected to the anode line La. From the connection relations, the first and second drive transistors 16 and 17, apparently (on the circuit), function as a single transistor (drive transistor 15). FIG. 4 is a circuit diagram showing the first and second drive transistors 16 and 17 as the drive transistor 15. Concrete circuit operation will be described with reference to FIG. 4.

A drive circuit DS2 in FIG. 4 has the first selection transistor 13, the second selection transistor 14, the drive transistor 15, and the capacitor 18. As described above, the drive transistor 15 is made of the first and second drive transistors 16 and 17.

Of the first selection transistor 13, the gate electrode is connected to the gate line Lg, the drain electrode is connected to the anode line La, and the source electrode is connected to the gate electrode of the drive transistor 15. With regard to the second selection transistor 14, the gate electrode is connected to the gate line Lg, the source electrode is connected to the data line Ld, and the drain electrode is connected to the anode of the light emitting element 11. With regard to the drive transistor 15, the gate electrode is connected to the source electrode of the first selection transistor 13, the drain electrode is connected to the anode line La, and the source electrode is connected to the anode of the light emitting element 11. Two opposed electrodes of the capacitor 18 are connected to the gate and source electrodes of the drive transistor 15. The cathode of the light emitting element 11 is connected to reference potential Vss (for example, GND (ground)).

The system controller 95 controls the light emitting device 100 to perform write control and light emission control by using the anode driver 91, the gate driver 92, and the data driver 93. The system controller 95 performs those controls on the basis of image data supplied from the outside of the system controller 95.

First, the write control will be described. The system controller 95 controls the gate driver 92 to apply a voltage (high-level voltage) Vg having a voltage value equal to or larger than a predetermined threshold to one gate line Lg. By the application, a plurality of pixel circuits connected to the gate line Lg (in the row of the gate line Lg) are selected. The system controller 95 controls the anode driver 91 to apply a voltage Va having a voltage value of a non-emission level (a value lower than the reference potential Vss, for example, a negative voltage value) to the selected anode line La, and also controls the data driver 93 to apply a tone voltage Vd which is set to a negative voltage value in accordance with the image data to each of the data lines Ld.

By the above, the first selection transistor 13, the second selection transistor 14, and the drive transistor 15 enter the on state, and write current according to the potential difference which occurs between the gate and the source of the drive transistor 15 flows from the anode line La to the data line Ld direction via the transistor 14. At this time, in the capacitor 18, charges of an amount according to the potential difference between the gate and the source of the drive transistor 15 are stored, and the potential difference (a potential difference according to the tone voltage Vd) is retained. Since the potential of the anode of the light emitting element 11 becomes lower than that (reference potential Vss) of the cathode, no current flows in the light emitting element 11, and the light emitting element 11 does not emit light. In the case of making a light emitting element 11 emit light, for example, the tone voltage Vd which does not allow passage of write current is applied to the data line Ld connected to the pixel circuit 10 of the light emitting element 11, so that the write current does not flow.

The system controller 95 sequentially performs (scans) such write controls (application of Vg, Va, and Vd) on all of rows one by one in predetermined order (order from the top row to the bottom row in FIG. 2) and on all of pixel circuits 10 of the light emitting device 100. The system controller 95 performs the write control for a predetermined period per row.

The system controller 95 performs light emission control on the rows on which the write control is not performed (the rows in a nonselective period). The system controller 95 controls the gate driver 92 to apply the voltage (low-level voltage) Vg having a voltage value less than the predetermined threshold to the gate line Lg of each of the rows which are in the nonselective period, thereby turning off the first and second selection transistors 13 and 14. By the operation, the connection between the drive circuit DS2 and the data line Ld is interrupted. Since the charges are accumulated in the capacitor 18 also after the interruption, the drive transistor 15 maintains the on state. Further, the system controller 95 controls the anode driver 91 to apply the voltage Va having a voltage value of the light emission level (a value higher than the reference potential Vss) to the anode line La of a row which is in the nonselective period. In such a manner, the drive transistor 15 passes light emission drive current to the light emitting element 11.

Since the potential difference retained in the capacitor 18 corresponds to the potential difference occurring when the write current flows (that is, the potential difference according to the tone voltage Vd), the value of current flowing in the light emitting element 11 becomes almost equal to that of the write current. Consequently, the light emitting element 11 emits light with brightness according to the value of the tone voltage Vd. The system controller 95 performs such light emission control (application of the above-described Vg and Va), thereby making each of the light emitting elements 11 (pixels 111) of the pixel circuits 10 in a row in the nonselective period emit no light or emit light with brightness according to image data. Since the rows sequentially enter the nonselective period, the light emitting device 100 displays an image indicated by the image data as a whole. The light emitting device 100 is also a display device.

Figure 5:
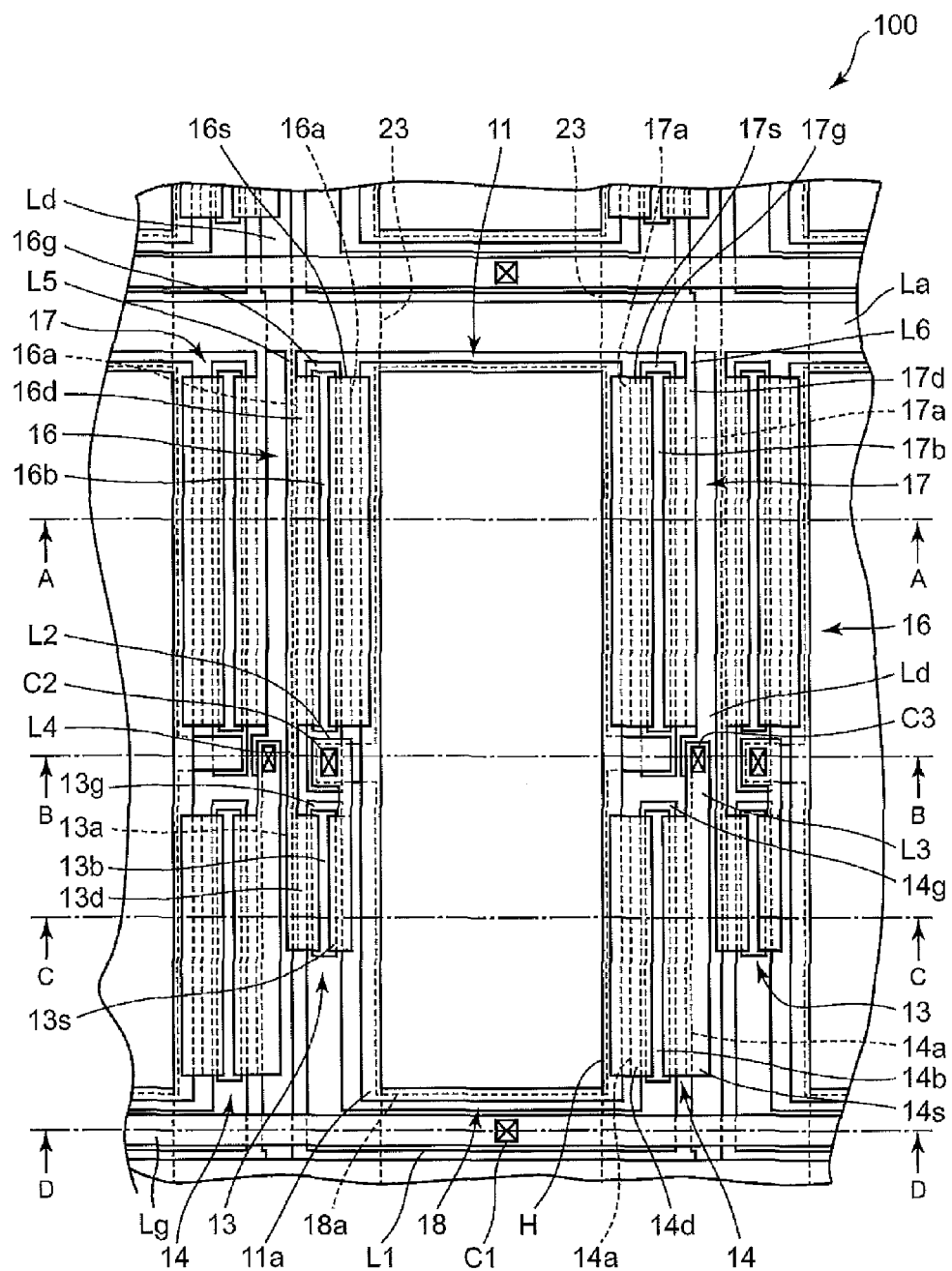
FIG. 5 is a schematic enlarged layout diagram showing the structure of the light emitting device of FIG. 1.
Figure 6A:
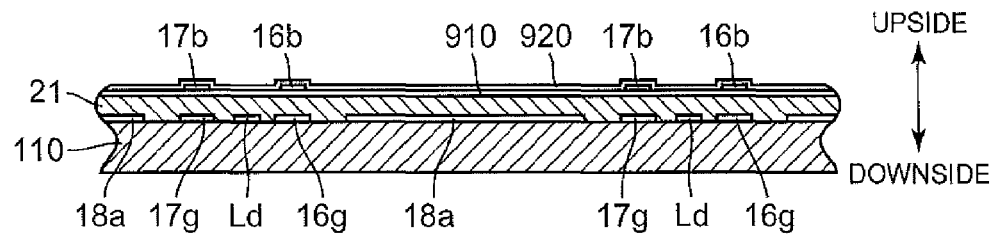
FIG. 6A is a diagram showing a cross-section taken along line A-A of FIG. 5 in a process of forming the light emitting device of FIG. 1.
Figure 6B:
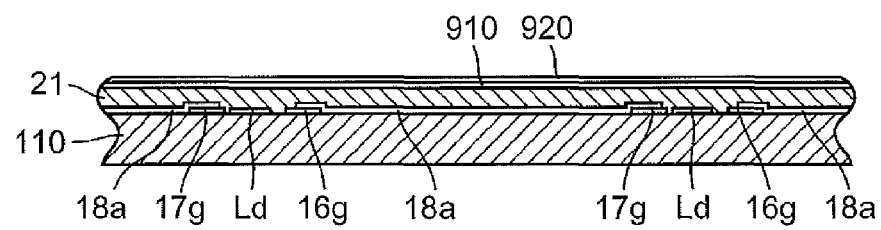
FIG. 6B is a diagram showing a cross-section taken along line B-B of FIG. 5 in a process of forming the light emitting device of FIG. 1.
Figure 6C:
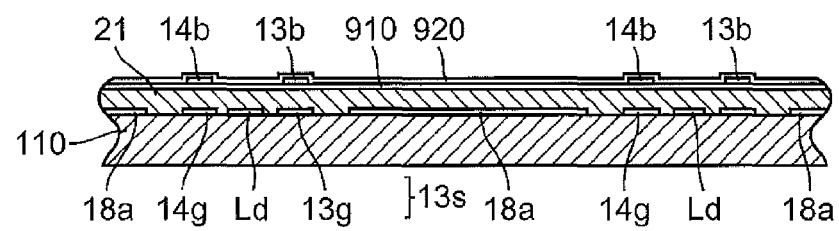
FIG. 6C is a diagram showing a cross-section taken along line C-C of FIG. 5 in a process of forming the light emitting device of FIG. 1.
Figure 6D:
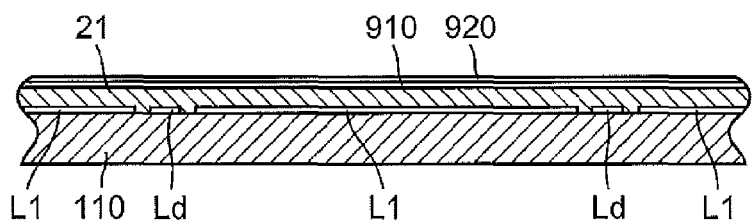
FIG. 6D is a diagram showing a cross-section taken along line D-D of FIG. 5 in a process of forming the light emitting device of FIG. 1.
Figure 7A:
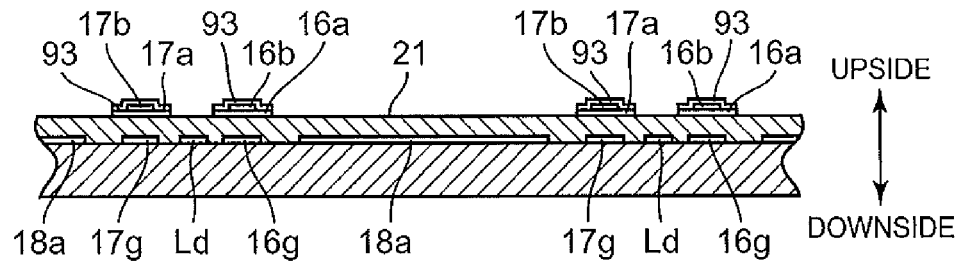
FIG. 7A is a diagram showing a cross-section taken along line A-A of FIG. 5 in a process of forming the light emitting device of FIG. 1.
Figure 7B:
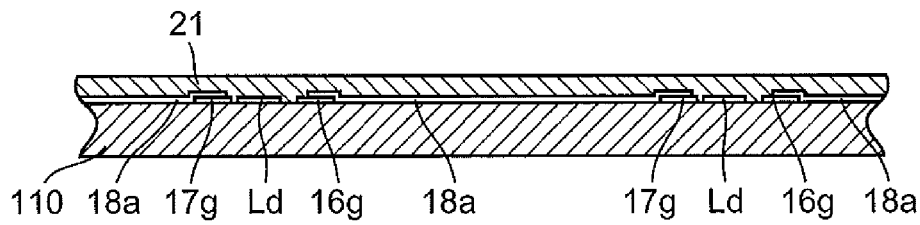
FIG. 7B is a diagram showing a cross-section taken along line B-B of FIG. 5 in a process of forming the light emitting device of FIG. 1.
Figure 7C:
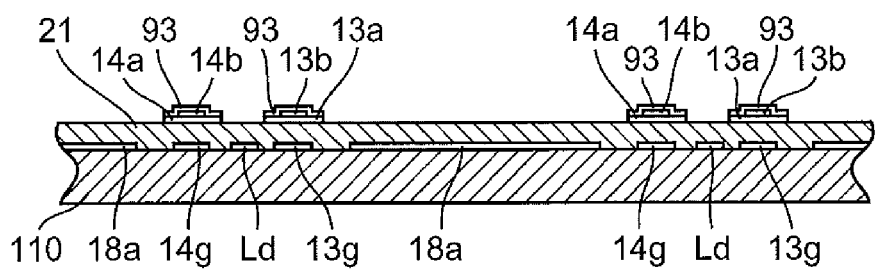
FIG. 7C is a diagram showing a cross-section taken along line C-C of FIG. 5 in a process of forming the light emitting device of FIG. 1.
Figure 7D:
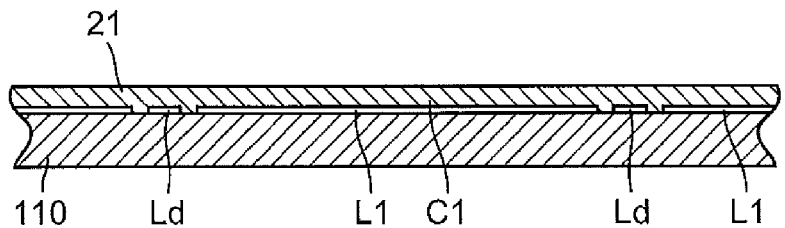
FIG. 7D is a diagram showing a cross-section taken along line D-D of FIG. 5 in a process of forming the light emitting device of FIG. 1.
Figure 8A:
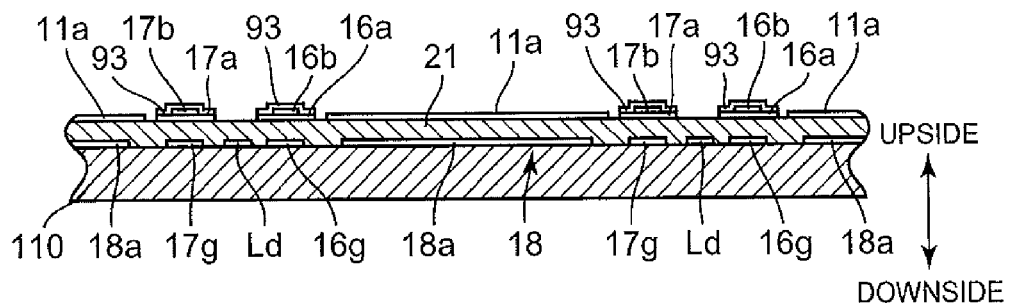
FIG. 8A is a diagram showing a cross-section taken along line A-A of FIG. 5 in a process of forming the light emitting device of FIG. 1.
Figure 8B:
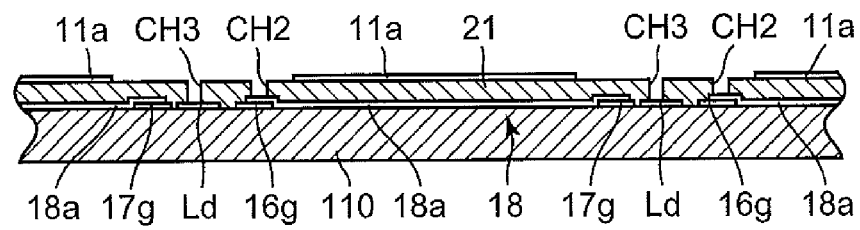
FIG. 8B is a diagram showing a cross-section taken along line B-B of FIG. 5 in a process of forming the light emitting device of FIG. 1.
Figure 8C:
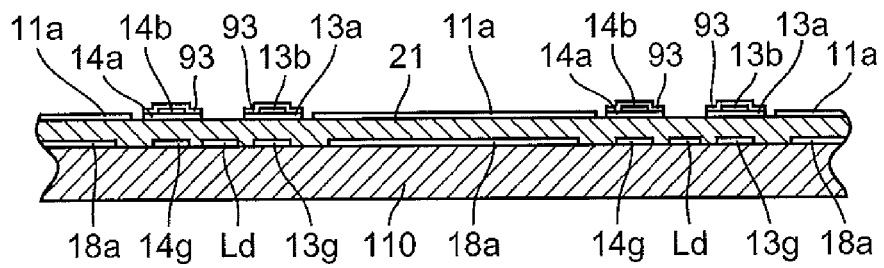
FIG. 8C is a diagram showing a cross-section taken along line C-C of FIG. 5 in a process of forming the light emitting device of FIG. 1.
Figure 8D:
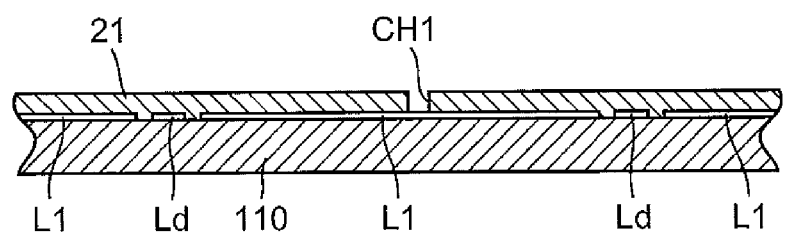
FIG. 8D is a diagram showing a cross-section taken along line D-D of FIG. 5 in a process of forming the light emitting device of FIG. 1.
Figure 9A:
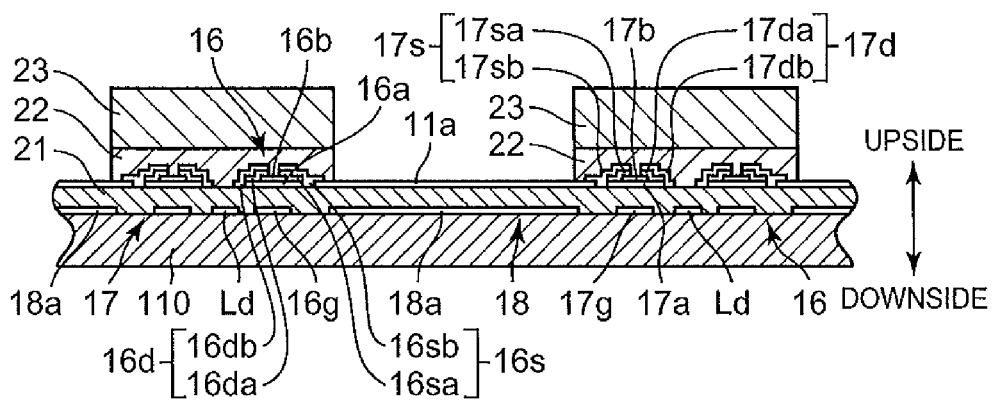
FIG. 9A is a diagram showing a cross-section taken along line A-A of FIG. 5 in a process of forming the light emitting device of FIG. 1.
Figure 9B:
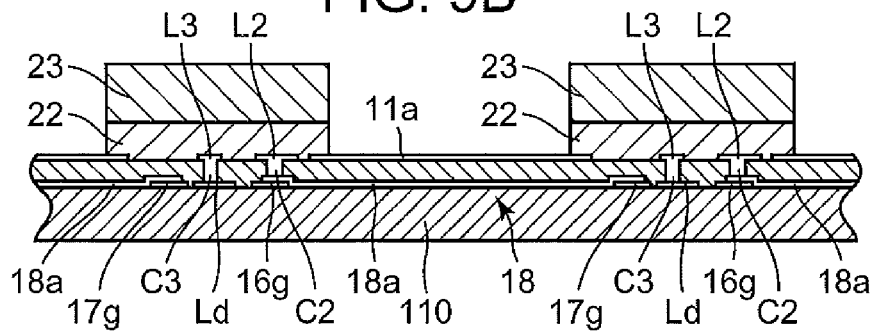
FIG. 9B is a diagram showing a cross-section taken along line B-B of FIG. 5 in a process of forming the light emitting device of FIG. 1.
Figure 9C:
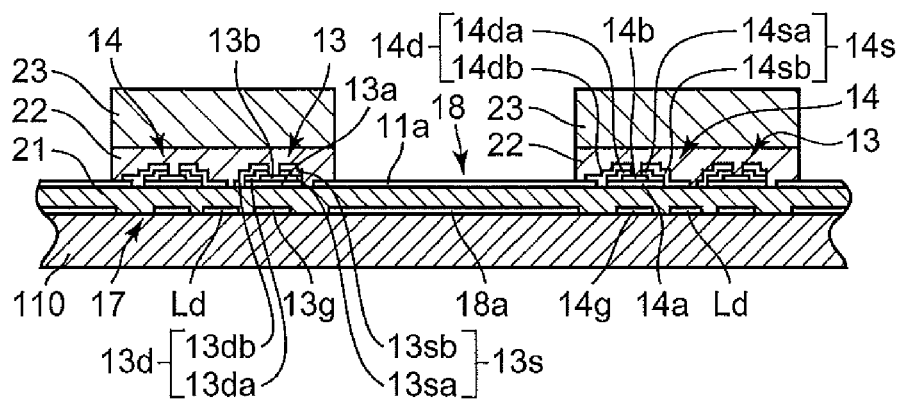
FIG. 9C is a diagram showing a cross-section taken along line C-C of FIG. 5 in a process of forming the light emitting device of FIG. 1.
Figure 9D:
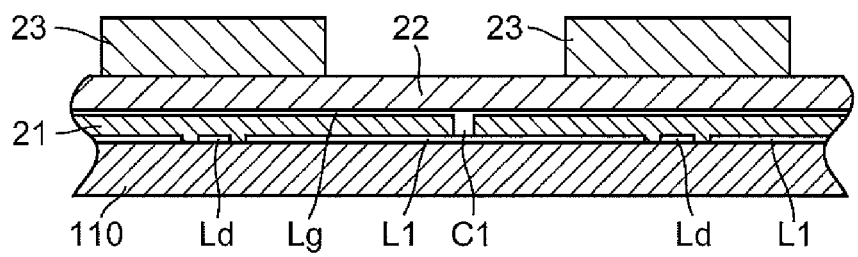
FIG. 9D is a diagram showing a cross-section taken along line D-D of FIG. 5 in a process of forming the light emitting device of FIG. 1.
Figure 10A:
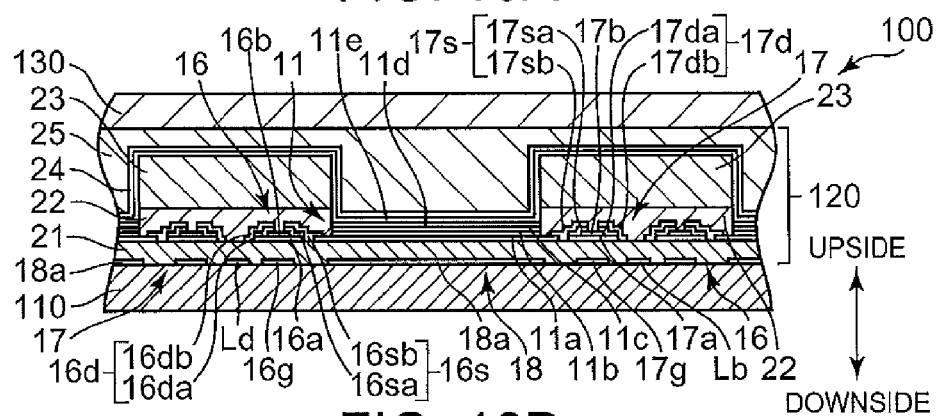
FIG. 10A is a diagram showing a cross-section taken along line A-A of FIG. 5.
Figure 10B:
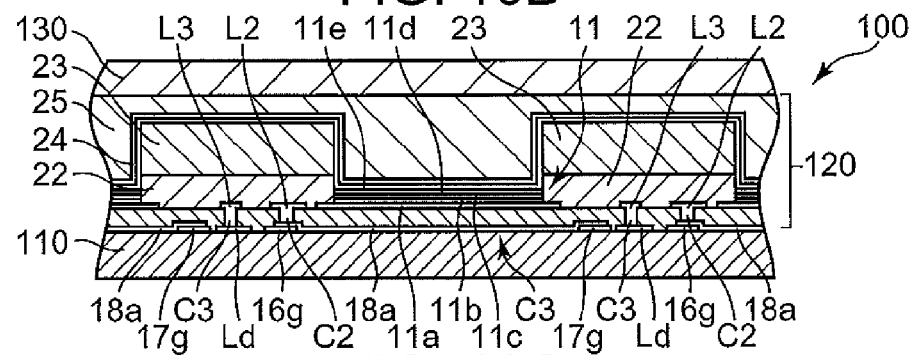
FIG. 10B is a diagram showing a cross-section taken along line B-B of FIG. 5.
Figure 10C:
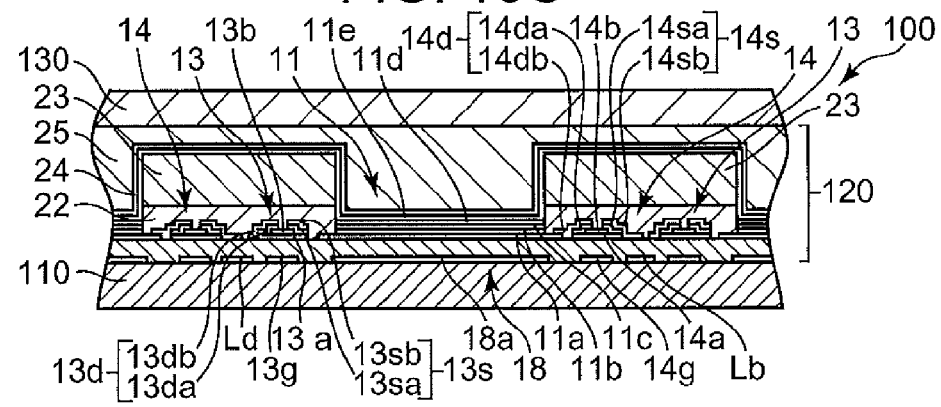
FIG. 10C is a diagram showing a cross-section taken along line C-C of FIG. 5.
Figure 10D:
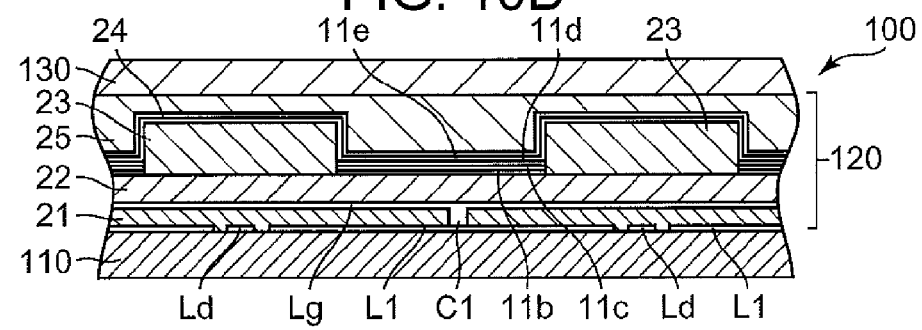
FIG. 10D is a diagram showing a cross-section taken along line D-D of FIG. 5.

Next, a concrete structure of the light emitting device 100 will be described with reference to FIGS. 5 to 10D. In FIGS. 6A to 10D, hatching which indicates a section of a predetermined element is not properly drawn in consideration of easier viewing. In FIGS. 6A to 10D, all of the elements are shown in section. The light emitting device 100 has the substrate 110, a stack body 120 formed on the substrate 110, and a sealing substrate 130 for sealing the stack body 120. The stack body is obtained by stacking a plurality of layers and formed in a structure realizing the circuit configuration shown in FIGS. 2 and 3. FIG. 5 is a diagram paying attention to one pixel circuit 10. In the description, the direction of stacking layers (the top side in the drawings) will be called "up" and the opposite side will be called "down".

In the embodiment, in plan view of the light emitting device 100 (in view from the direction of normal to the substrate 110 (for example, point of view of FIG. 5)), the first and second drive transistors 16 and 17 are disposed while sandwiching the light emitting element 11 (refer to FIG. 5). It can be also considered that the drive transistor 15 is disposed by being divided to the first and second drive transistors 16 and 17 while sandwiching the light emitting element 11.

The details of the concrete structure of the light emitting device 100 will be described together with the method of forming the light emitting device 100. In the following description, it is assumed that, at the time of stacking layers, elements (such as connection terminals) other than the above-described elements are also properly formed.

First, the transparent substrate 110 having insulating properties such as a glass substrate is prepared.

Next, on the top face of the substrate 110, a metal layer such as an Mo film, a Cr film, an Al film, a Cr/Al stack film, an AlTi alloy film, an AlNdTi alloy film, or an MoNb alloy film which is opaque to light emitted from the light emitting element 11 (that is, does not transmit light emitted from the light emitting element 11) is formed by sputtering, vacuum deposition, or the like. The metal layer is patterned to form a gate electrode 13g of the first selection transistor 13, a gate electrode 14g of the second selection transistor 14, a gate electrode 16g of the first drive transistor 16, a gate electrode 17g of the second drive transistor 17, a line L1 electrically connecting the gate electrodes 13g and 14g, the data line Ld, and the like in predetermined shapes. In the following, the electrodes and lines will be collectively called the metal layer.

Subsequently, by sputtering, vacuum deposition, or the like, a transparent conductive film made of ITO (Indium Tin Oxide), ZnO, or the like which is transparent to light emitted from the light emitting element 11 (that is, which transmits light emitted from the light emitting element 11) is formed so as to cover the above-described metal film on the top face of the substrate 110. After that, the transparent conductive film is patterned by photolithography to form a third electrode 18a of the capacitor 18. In the periphery of the third electrode 18a, a first side (a side on the left side in FIG. 5) and a second side (a side on the right side in FIG. 5) are formed so as to be opposed to each other. The third electrode 18a is formed so that a part of the third electrode 18a is in contact with and overlaps the gate electrodes 16g and 17g. The third electrode 18a formed as described above is electrically connected to the gate electrode 16g on the first side of the third electrode 18a, and is electrically connected to the gate electrode 17g on the second side of the third electrode 18a. That is, the gate electrodes 16g and 17g are electrically connected to each other via the third electrode 18a.

Next, on the top face of the substrate 110, an insulating layer (gate insulating film) 21 made of SiN or the like is formed so as to cover the metal film and the third electrode 18a, formed as described above, by CVD (Chemical Vapor Deposition) or the like. Further, a semiconductor film 910 (i-Si) made of amorphous silicon or the like is formed on the insulating film 21 by CVD or the like. Successively, on the semiconductor film 910, an insulating film made of SiN or the like is formed by CVD or the like.

The insulating films formed as described above are patterned by photolithography or the like to form a protection layer 13b of the first selection transistor 13, a protection layer 14b of the second selection transistor 14, a protection layer 16b of the first drive transistor 16, and a protection layer 17b of the second drive transistor 17 in predetermined shapes. Each of the protection layers protects a semiconductor layer which will be described later in each transistor.

Further, on the top face of the semiconductor film 910, a film 920 made of amorphous silicon or the like containing n-type impurity is formed so as to cover the protection layers by CVD or the like. The states during the formation are shown in FIGS. 6A to 6D. By patterning the film 920 and the semiconductor film 910 by photolithography or the like, a semiconductor layer 13a of the first selection transistor 13, a semiconductor layer 14a of the second selection transistor 14, a semiconductor layer 16a of the first drive transistor 16, a semiconductor layer 17a of the second drive transistor 17, and an impurity layer 93 covering the semiconductor layers and protection layers are formed. The states during the formation are shown in FIGS. 7A to 7D. A channel region is formed in each of the semiconductor layers.

Next, by sputtering, vacuum deposition, or the like, a transparent conductive film made of ITO, ZnO, or the like which is transparent to the light emitted from the light emitting element 11 is formed on the insulating layer 21. After that, the transparent conductive film is patterned by photolithography to form the first electrode (pixel electrode) 11a. The first electrode 11a serves as an electrode for defining the pixel 111. The first electrode 11a functions as the anode of the light emitting element 11. The first electrode 11a and the third electrode 18a are opposed to each other via the insulating layer 21. The first electrode 11a, the third electrode 18a, and the insulating layer 21 between them function as the capacitor 18. As described above, in the embodiment, the capacitor 18 and the light emitting element 11 share the electrodes.

In the insulating layer 21, contact holes CH1 to CH3 are formed. The contact holes CH1 to CH3 are holes for electrically connecting upper and lower layers. The states during the formation are shown in FIGS. 8A to 8D. Through the contact hole CH1, the line L1 is exposed. Through the contact hole CH2, the contact part between the gate electrode 16g and the third electrode 18a is exposed. Through the contact hole CH3, the data line Ld is exposed.

Next, for example, a metal layer such as an Mo film, a Cr film, an Al film, a Cr/Al stack film, an AlTi alloy film or an AlNdTi alloy film, or an MoNb alloy film is formed by sputtering, vacuum deposition, or the like on the insulating layer 21 so as to cover the impurity layer 93 and the like. After that, the metal layer and the impurity layer 93 are patterned by photolithography or the like to form, in a lump, an impurity layer 13sa, a conductor layer 13sb, an impurity layer 13da, a conductor layer 13db, an impurity layer 14sa, a conductor layer 14sb, an impurity layer 14da, a conductor layer 14db, an impurity layer 16sa, a conductor layer 16sb, an impurity layer 16da, a conductor layer 16db, an impurity layer 17sa, a conductor layer 17sb, an impurity layer 17da, a conductor layer 17db, the anode line La, the gate line Lg, and lines L2, L3, L4, L5, and L6.

The impurity layer 13sa and the conductor layer 13sb function as a source electrode 13s of the first selection transistor 13. The impurity layer 13da and the conductor layer 13db function as a drain electrode 13d of the first selection transistor 13. The impurity layer 14sa and the conductor layer 14sb function as a source electrode 14s of the second selection transistor 14. The impurity layer 14da and the conductor layer 14db function as a drain electrode 14d of the second selection transistor 14. The impurity layer 16sa and the conductor layer 16sb function as a source electrode 16s of the first drive transistor 16. The impurity layer 16da and the conductor layer 16db function as a drain electrode 16d of the first drive transistor 16. The impurity layer 17sa and the conductor layer 17sb function as a source electrode 17s of the second drive transistor 17. The impurity layer 17da and the conductor layer 17db function as a drain electrode 17d of the second drive transistor 17. In such a manner, the transistors are formed.

The source electrode and the drain electrode in each transistor cover the semiconductor layer and are disposed so as to be apart from each other and opposed to each other along the channel length direction of the semiconductor layer (the direction perpendicular to the vertical direction (the horizontal direction of the drawing sheets of FIGS. 9A to 9D)). The protection layer in each transistor protects the semiconductor layer at the time of patterning the metal layer and the impurity layer 93. In each transistor, the impurity layer realizes low-resistance contact between the conductor layer and the semiconductor layer.

The line L2 is to electrically connect the source electrode 13s and the gate electrode 16g and is formed integrally with the conductor layer 13sb, and they are connected to each other. The line L3 is to electrically connect the source electrode 14s and the data line Ld and is formed integrally with the conductor layer 14sb, and they are connected to each other. The line L4 is to electrically connect the drain electrodes 13d and 16d and is formed integrally with the conductor layers 13db and 16db, and they are connected to each other. The line L5 is to electrically connect the drain electrode 16d and the anode line La and is formed integrally with the conductor layer 16db and the anode line La, and they are connected to each other. The line L6 is to electrically connect the drain electrode 17d and the anode line La and is formed integrally with the conductor layer 17db and the anode line La, and they are connected to each other.

Each of the conductor layers 14db, 16sb, and 17sb is formed so as to be in contact with the first electrode 11a, and the drain electrode 14d and the source electrodes 16s and 17s are electrically connected to the first electrode 11a.

At the time of forming the metal layer, a part of the metal layer enters the contact holes CH1 to CH3, thereby forming contact parts C1 to C3.

The contact part C1 is linked to the gate line Lg and is in contact with the line L1. Via the contact part C1, the gate electrodes 13g and 14g and the gate line Lg are electrically connected. The contact part C2 is linked to the line L2 and is in contact with the contact part (the third electrode 18a) between the gate electrode 16g and the third electrode 18a. Via the contact part C2, the gate electrode 16g, the third electrode 18a, and the line L2 (that is, the source electrode 13s) are electrically connected. The contact part C3 is linked to the line L3 and is in contact with the data line Ld. Via the contact part C3, the data line Ld and the line L3 (that is, the source electrode 14s) are electrically connected.

Next, an insulating film made of SiN or the like is formed by CVD or the like so as to cover an end part of the first electrode 11a, the source electrode and the drain electrode of each transistor, the anode line La, and the like. By patterning the insulating film, an insulating layer 22 is formed. The insulating layer 22 defines each of the pixels 111 (light emitting elements 11), has a plurality of rectangular openings H (through holes contributing to aperture ratio) each for exposing the first electrode 11a, and is formed in a lattice shape. When the area of the opening H is large, the aperture ratio increases. The insulating layer 22 makes the neighboring first electrodes 11a insulated from each other, and protects each of the transistors, the anode lines La, and the like by insulation.

Subsequently, for example, a photosensitive polyimide-based insulating resin material is applied, patterned, and cured, thereby forming a division wall 23 on the insulating film 22. The division wall 23 has a stripe-shaped opening which is long in the column direction so as to open the plurality of first electrodes 11a arranged along the column direction. The division wall 23 is provided to define the shape of an organic EL layer which will be described later. The states until here are shown in FIGS. 9A to 9D.

A hole injection layer 11b, a light emission layer 11c, and an electron transport layer 11d are applied by colors used for display to the inside of the openings in the division wall 23 to stack an organic EL layer (light emission layer) made of the hole injection layer 11b, the light emission layer 11c, and the electron transport layer 11d on the first electrode 11a. Each of the hole injection layer 11b and the electron transport layer 11d is formed of a known polymer material or the like. The light emission layer 11c is formed of a known polymer light-emission material or the like.

A second electrode (opposed electrode) 11e covering the openings in the division wall 23 and the division wall 23 and continued to each of the first electrodes 11a via the organic EL layers so as to be opposed is formed. The second electrode 11e is formed by vacuum deposition, sputtering, or the like as a stack-layer structure having: a lower layer of an electron injection type having a light reflection characteristic and made of a conductive material, for example, a material having a thickness of 1 to 10 nm and a low work function such as Li, Mg, Ca, Ba, or In; and an upper layer having a high work function and made of a light-reflection conductive metal such as Al, Cr, Ag, or palladium silver based alloy having a thickness of 100 nm or larger. The second electrode 11e is connected to a not-illustrated terminal at the reference potential Vss.

The part of the organic EL layer and the second electrode 11e which overlap the first electrode 11a in plan view of the light emitting device 100 functions as the light emitting element 11. The organic EL layer generates light by application of voltage across the first and second electrodes 11a and 11e. Light emitted upward from the organic EL layer is reflected by the second electrode 11e, goes downward, passes through the first electrode 11a, the insulating layer 21, the substrate 110, and the like, and goes out from the bottom of the light emitting device 100 The light emitted downward from the organic EL layer passes through the first electrode 11a, the insulating layer 21, the substrate 110, and the like, and goes out from the bottom of the light emitting device 100. As described above, the light emitting device 100 is of a so-called bottom emission type that emits light from the substrate 110.

Next, a passivation film 24 made of $Si_3N_4$, $SiO_2$, or the like is formed by a proper method such as CVD so as to cover the second electrode 11e. The passivation film 24 is to interrupt invasion of water to the second electrode 11e side.

A sealing material 25 made of synthetic resin or the like is applied on the entire surface or a peripheral part of the substrate 110 on which the passivation film 24 is formed. The sealing substrate 130 is put on the sealing material 25, so that the substrate 110 on which the passivation film 24 is formed and the sealing substrate 130 are joined to each other via the sealing material 25. By irradiating the sealing material 25 with ultraviolet light to apply heat or by pressurizing the sealing material 25, the sealing material 25 is cured so that the substrate 110 on which the passivation film 24 is formed, the sealing material 25, and the sealing substrate 130 are integrally joined. In such a manner, the layers formed as described above are sealed with the sealing material 25 and the sealing substrate 130, and the light emitting device 100 is completed (refer to FIGS. 10A to 10D).

Figure 11:
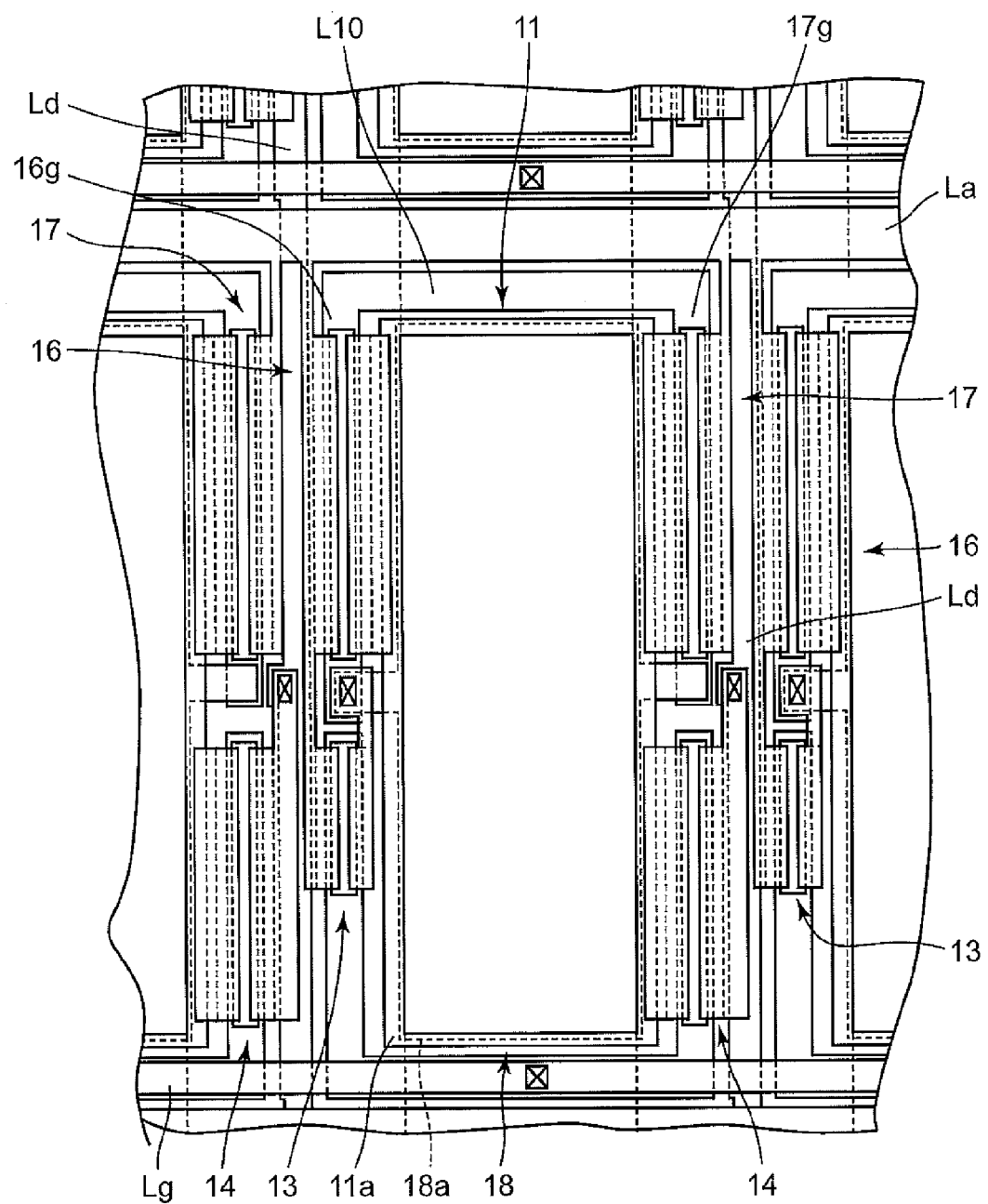
FIG. 11 is a schematic enlarged layout diagram showing the structure of a light emitting device of a comparative example.

In the embodiment, with the configuration, the light emitting element 11 and the capacitor 18 are disposed in overlapped positions in plan view of the light emitting device 110, further, the first drive transistor 16 is disposed on the first side (left side in FIG. 5) of the first electrode 11a, the second drive transistor 17 is disposed on the second side (right side in FIG. 5) opposed to the first side in the first electrode 11a, and the gate electrode 16g of the first drive transistor 16 and the gate electrode 17g of the second drive transistor 17 are electrically connected to each other via the third electrode 18a of the capacitor 18. The anode line La is disposed on a third side (upper side in FIG. 5) different from the first and second sides of the first electrode 11a, and extends in the row direction. In the case of electrically connecting the gate electrodes 16g and 17g, for example, they may be electrically connected by using a line L10 as shown in FIG. 11. However, a region in which the light emitting element 11 is not provided (a frame part of the insulating layer 22, that is, a region on the outside of the opening H) becomes large, and the aperture ratio becomes low. Since the area of the third electrode 18a of the capacitor 18 becomes smaller by the amount of providing the line L10, the area of the capacitor 18 becomes smaller (the area in plan view of the light emitting device 100). The structure of FIG. 11 is similar to that of FIG. 5 except for the point that the gate electrodes 16g and 17g are connected to each other by the line L10 which is formed integrally with the gate electrodes 16g and 17g, and the third electrode 18a and the gate electrode 17g are not electrically connected to each other, so that some reference numerals are not shown. The same reference numerals are designated to corresponding components in FIGS. 5 and 11.

In the embodiment, the gate electrodes 16g and 17g are electrically connected to each other via the third electrode 18a of the capacitor 18. Consequently, for example, something like the line L10 shown in FIG. 11 is unnecessary. The area of the region in which the light emitting element 11 is not provided can be made small, and the third electrode 18a can be made large, so that the capacitor having higher aperture ratio and larger area as compared with the example shown in FIG. 11 can be obtained. Since the line L10 is unnecessary, wiring is simplified. In the embodiment, in the circuit configuration, the gate electrodes 16g and 17g and the third electrode 18a have to be electrically connected. In the embodiment, the third electrode 18a is effectively used for the electric connection between the gate electrodes 16g and 17g. Further, as in the embodiment, the drive transistor 15 generally has to be a transistor having a wide channel width. In the case of disposing such a transistor, the transistors may be disposed dividedly around the light emitting element 11 as described above. In the embodiment, however, since something like the line L1 is unnecessary, the capacitor having high aperture ratio and large area can be obtained. In addition, the light emitting element 11 and the capacitor 18 overlap in the layer direction (the vertical direction in FIGS. 10A to 10D and the like) in the embodiment, so that the area of the light emitting element 11 can be made large and, simultaneously, the area of the capacitor 18 is also increased. In the embodiment, the area of the light emitting element 11 is provided largely in the direction of the channel width of the transistors. Consequently, the channel width of the first drive transistor 16 and the second drive transistor disposed dividedly around the light emitting element 11 (that is, the channel width of the drive transistor 15) can be increased.

In the embodiment, the first electrode 11a and the third electrode 18a opposed to the first electrode 11a via the insulating layer 21 function as the capacitor 18, so that the stack-layer structure is simple. Since the gate electrodes 16g and 17g are electrically connected to each other via the third electrode 18a, the aperture ratio is excellent.

Figure 12A:
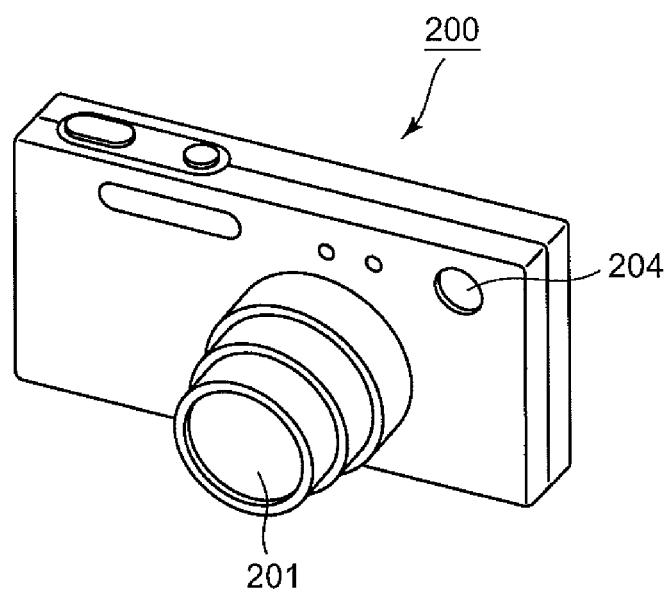
FIG. 12A is a perspective front view of a digital camera as an electronic device for which the light emitting device of FIG. 1 is used.
Figure 12B:
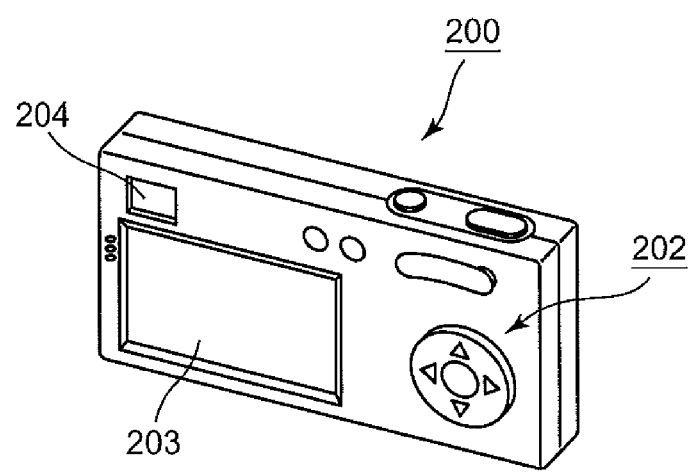
FIG. 12B is a perspective rear view of the digital camera as an electronic device for which the light emitting device of FIG. 1 is used.
Figure 13:
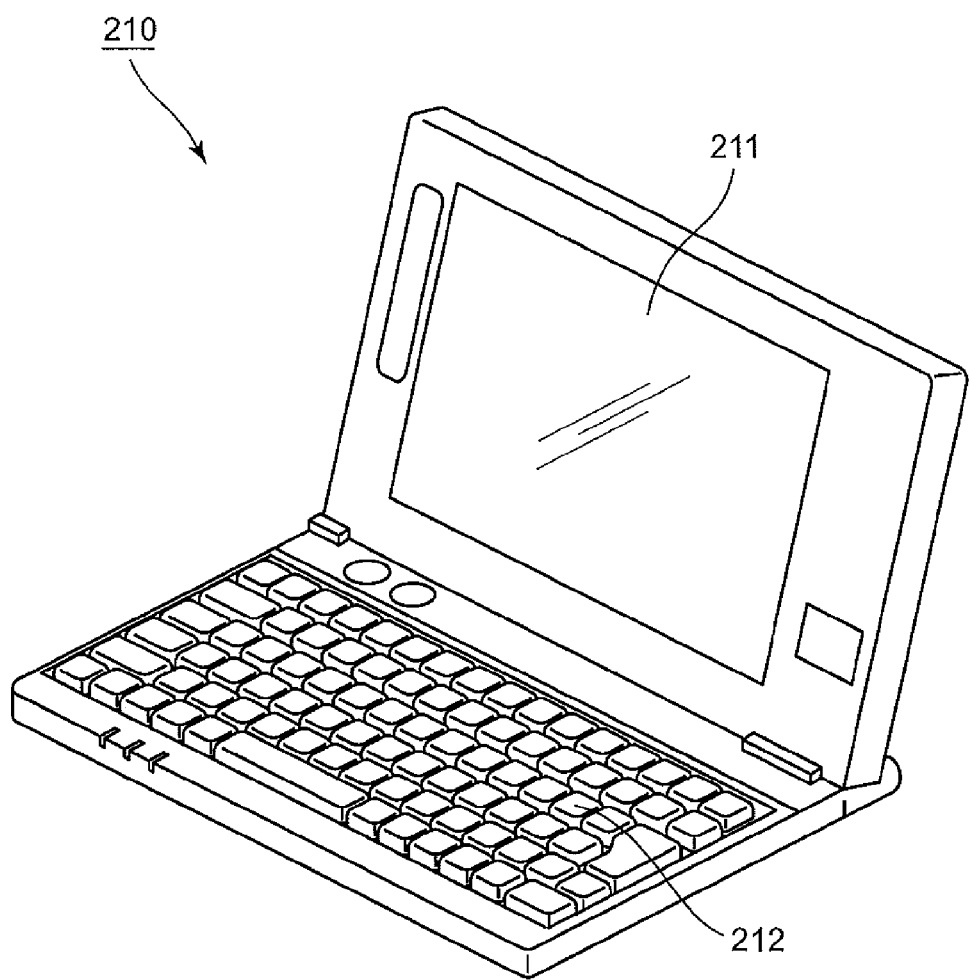
FIG. 13 is a perspective view of a personal computer as an electronic device for which the light emitting device of FIG. 1 is used.
Figure 14:
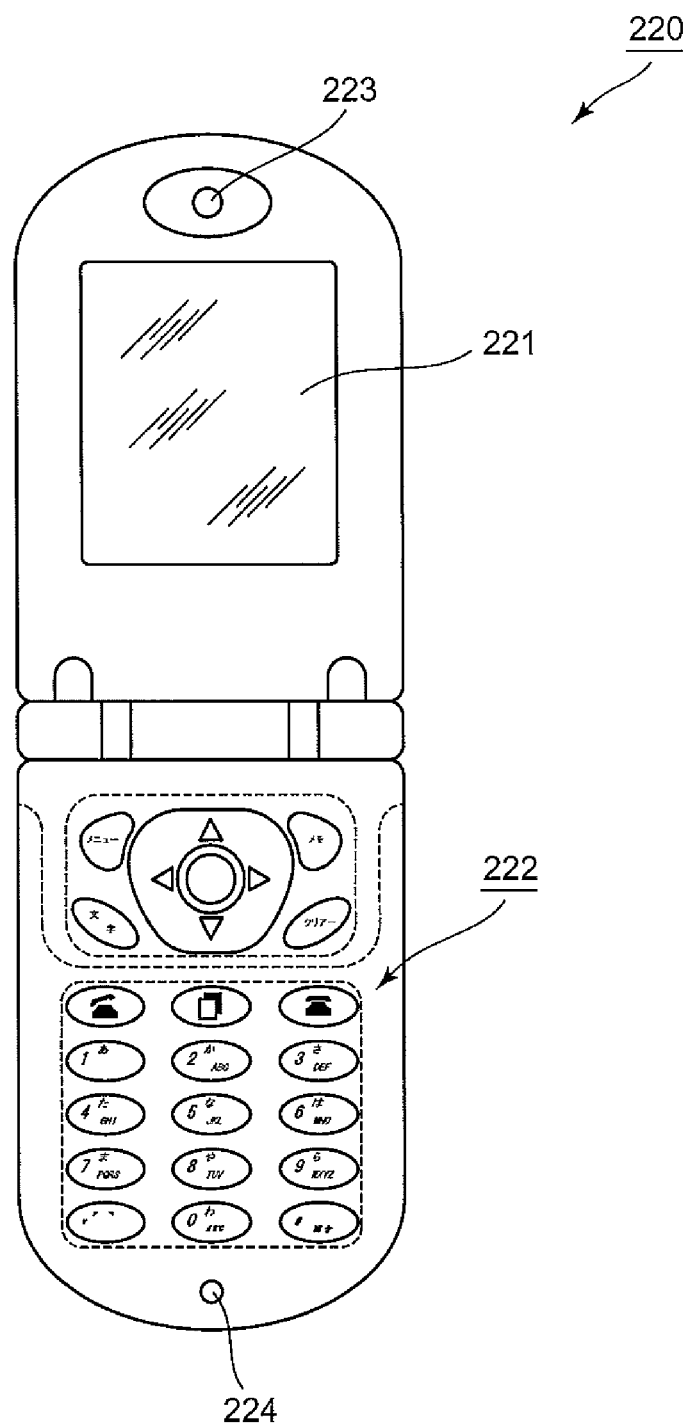
FIG. 14 is a diagram showing a cellular phone as an electronic device for which the light emitting device of FIG. 1 is used.
Figure 15:
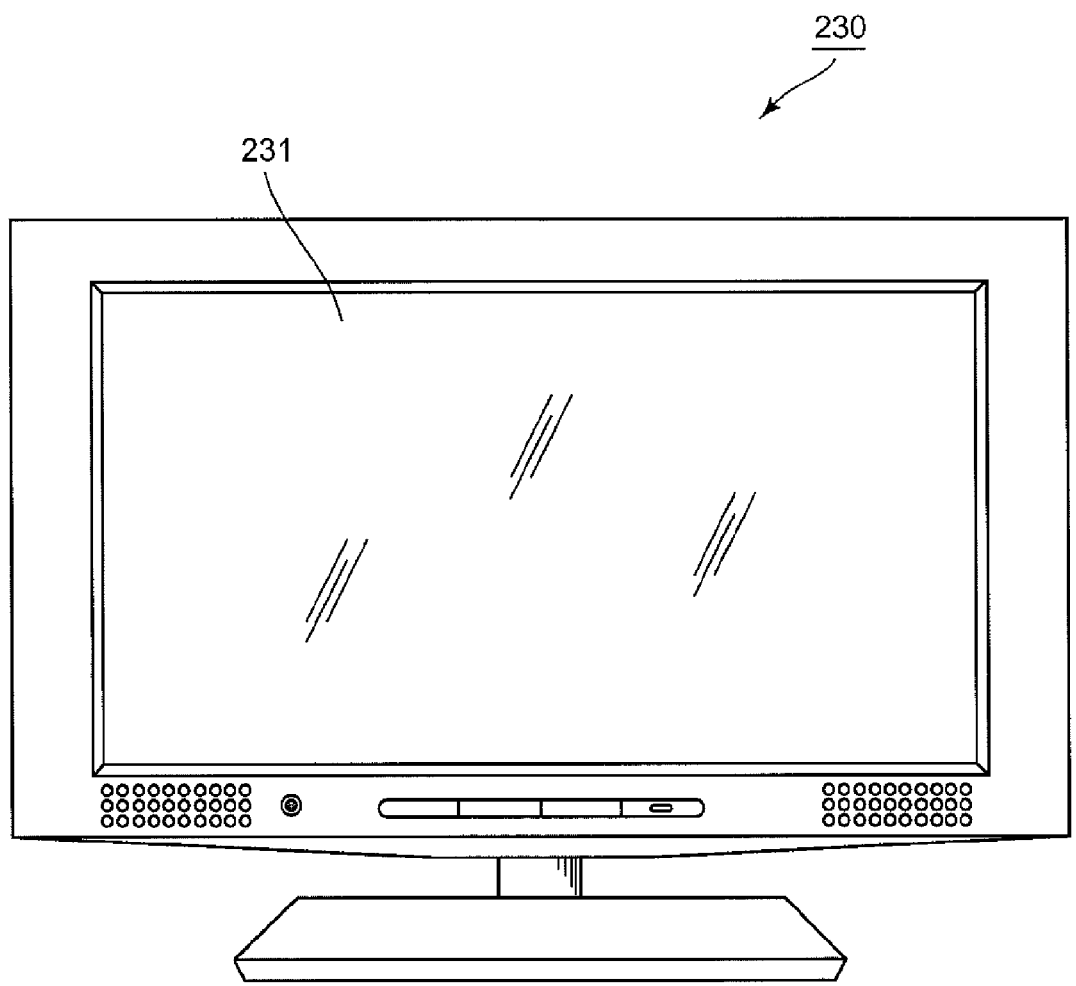
FIG. 15 is a diagram showing a television set as an electronic device for which the light emitting device of FIG. 1 is used.

The light emitting device 100 according to the embodiment can be assembled in an electronic device (display device) such as a digital camera as shown in FIGS. 12A and 12B, a personal computer as shown in FIG. 13, a cellular phone as shown in FIG. 14, or a television set (TV) as illustrated in FIG. 15.

As shown in FIGS. 12A and 12B, a digital camera 200 has a lens unit 201, an operation unit 202, a display unit 203, and a finder 204. The light emitting device 100 is used for the display unit 203.

A personal computer 210 shown in FIG. 13 has a display unit 211 and an operation unit 212. The light emitting device 100 is used for the display unit 211.

A cellular phone 220 shown in FIG. 14 has a display unit 221, an operation unit 222, a receiver unit 223, and a transmitter unit 224. The light emitting device 100 is used for the display unit 221.

A television set 230 shown in FIG. 15 has a display unit 231. The light emitting device 100 is used for the display unit 231.

Obviously, the present invention is not limited to the foregoing embodiment and can be variously changed without departing from the technical idea of the present invention.

Figure 16:
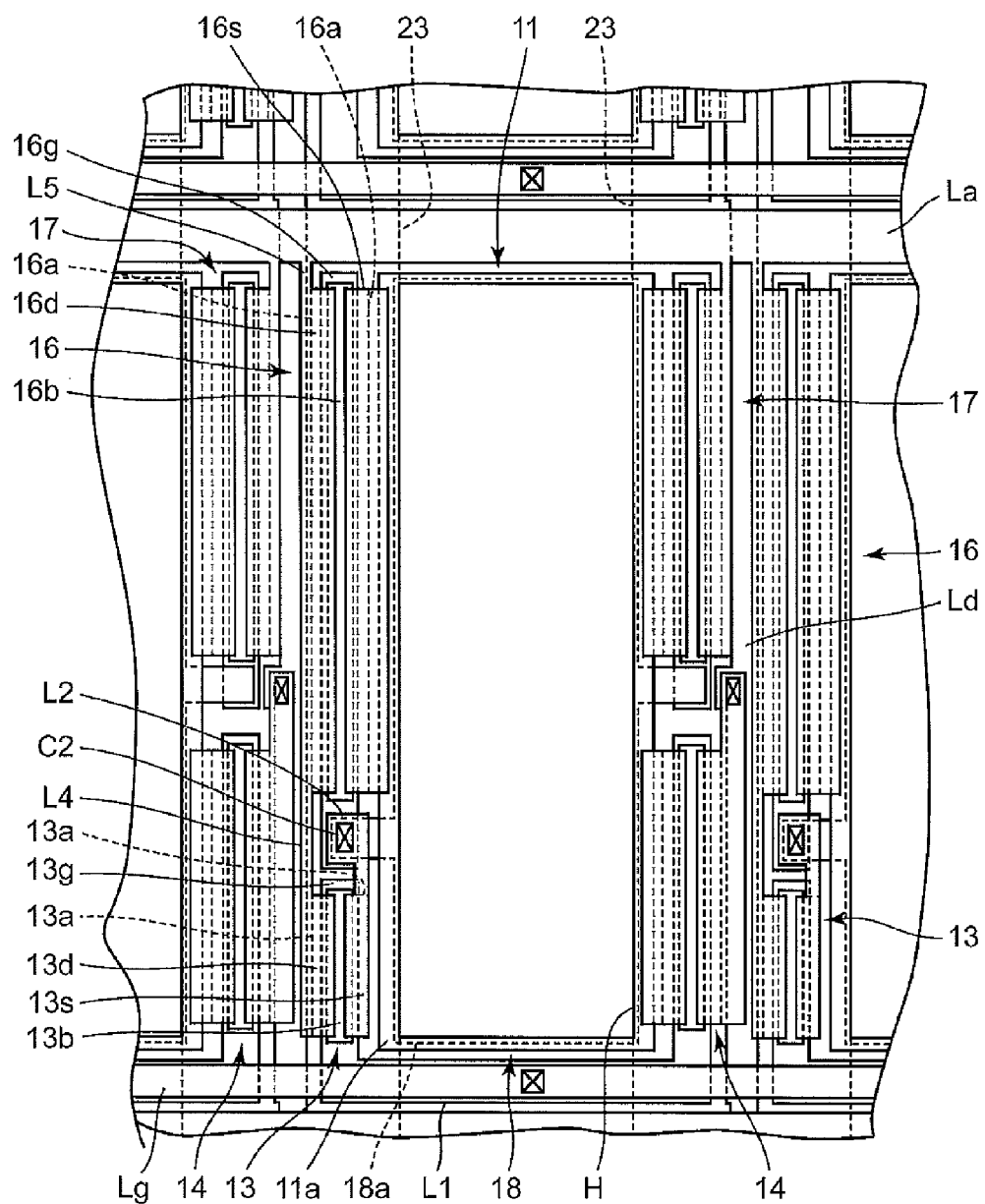
FIG. 16 is a schematic enlarged layout diagram showing the structure of a light emitting device as a modification of the present invention.

For example, although the channel width of the first drive transistor 16 and that of the second drive transistor 17 are almost the same, they may be different from each other. For example, as illustrated in FIG. 16, the channel width of the first drive transistor 16 may be larger than that of the second drive transistor 17. For the channel width of each of the transistors including the first and second drive transistors 16 and 17, a proper value can be employed. In FIG. 6, reference numerals are not shown for the same components as those in FIG. 5. The same reference numeral is designated to components having the same function.

The first and second drive transistors 16 and 17 may be two transistors in three or more transistors dividedly provided.

In the embodiment, the first side of the first electrode 11a and the second side of the first electrode 11a are sides opposed to each other in the first electrode 11a, and the first side of the third electrode 18a and the second side of the third electrode 18a are sides opposed to each other in the third electrode 18a. Since the gate electrodes 16g and 17g are electrically connected to each other via the third electrode 18a, the long line L10 becomes unnecessary and, particularly, the aperture ratio becomes better. The first side of the first electrode 11a and the second side of the first electrode 11a may be sides which meet in the first electrode 11a. The first side of the third electrode 18a and the second side of the third electrode 18a may be sides which meet in the third electrode 18a. In this case as well, the aperture ratio improves to a certain degree.

Although the signal lines, the electrodes of the transistors, and the like are formed of opaque metals or the like in the above, for example, the gate electrodes 13g, 14g, 16g, and 17g, the data line Ld, and the like may be constructed together with the third electrode 18a by a transparent conductive film made of ITO or the like. For example, the conductor layers 13sb, 13db, 14sb, 14db, 16sb, 16db, 17sb, and 17db, the anode line La, the gate line Lg, and the like may be constructed together with the first electrode 11a by a transparent conductive film made of ITO or the like.

The light emitting device 100 may be a light emitting device of a so-called top emission type which emits light from the sealing substrate 130 side. For example, in a part where the first electrode 11a is disposed, an electrode of a stack-layer structure is disposed, which has: a lower layer having a light reflection characteristic and high work function, made of a light-reflection conductive metal such as Al, Cr, Ag, palladium silver-based alloy, or the like having a thickness of 100 nm or larger; and an upper layer of an electron injection type made of a conductive material, for example, a material having low work function such as Li, Mg, Ca, Ba, or In and having a thickness of 1 to 10 nm. In the part where the second electrode 11e is disposed, an electrode formed by patterning a transparent conductive film made of ITO, ZnO, or the like so as to transmit light emitted from the organic EL layer is disposed. That is, in a light emitting device of the top emission type, members positioned upper than the organic EL layer (the second electrode 11e, the passivation film 24, the sealing material 25, and the sealing substrate 130) are formed of transparent material.

Although the organic EL layer of the three-layer structure is described above as an example of the light emitting layer, the structure of the light emitting layer is not limited to the above-described one but may be constructed by, for example, the hole injection layer 11b and the light emitting layer 11c. The light emitting element 11 is not limited to an organic EL element but may be another light emitting element (for example, inorganic EL element) as long as it has a pair of opposed electrodes and a light emitting layer provided between the electrodes, and the light emitting layer emits light by application of voltage.

In the above description, each of the first selection transistor 13, the second selection transistor 14, the first drive transistor 16, and the second drive transistor 17 is a thin film transistor (TFT) of the n-channel type as one kind of field effect transistors (FETs). It may be a transistor of another type such as a thin film transistor of the p-channel type. In the case of a thin film transistor of the p-channel type, the source and the drain replace each other.

The light emitting device 100 may be used for, for example, an exposure device of a printer. In this case, the pixels 111 are arranged, for example, in one line in the main scan direction of printing.

Except for the above-described configuration, an excellent aperture ratio is obtained also in a configuration where the light emitting element and the capacitor overlap each other, one transistor is divided into a plurality of transistors, the transistors are disposed at least on the first and second sides of the capacitor (light emitting element), and the gate electrodes of the divided plurality of transistors are electrically connected to one another via the electrode of the capacitor.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

The invention claimed is:

1. A light emitting device comprising:
   a light emitting element including a first electrode having a first side and a second side that are opposite to each other, a second electrode opposed to the first electrode in a layered manner, and a light emitting layer provided between the first electrode and the second electrode;
   a capacitor having a third electrode formed in a position overlapping the light emitting element and an insulating layer provided between the first electrode and the third electrode, the third electrode having a first side and a second side corresponding to the first side and the second side of the first electrode, respectively;
   a first drive transistor disposed on the first side of the first electrode and having a gate electrode connected to the first side of the third electrode; and
   a second drive transistor disposed on the second side of the first electrode and having a gate electrode connected to the second side of the third electrode.

2. A light emitting device comprising:
   a light emitting element including a first electrode having a first side and a second side that are opposite to each other, a second electrode opposed to the first electrode in a layered manner, and a light emitting layer provided between the first electrode and the second electrode;
   a capacitor having a third electrode formed in a position overlapping the light emitting element and an insulating layer provided between the first electrode and the third electrode, the third electrode having a first side and a second side corresponding to the first side and the second side of the first electrode, respectively;
   a first drive transistor disposed on the first side of the first electrode and having a gate electrode connected to the first side of the third electrode; and
   a second drive transistor disposed on the second side of the first electrode and having a gate electrode connected to the second side of the third electrode,
   wherein the third electrode is provided with a protrusion on the first side thereof and is connected to the gate electrode of the first drive transistor at the protrusion.

3. A light emitting device comprising:
   a light emitting element including a first electrode having a first side and a second side that are opposite to each other, a second electrode opposed to the first electrode in a layered manner, and a light emitting layer provided between the first electrode and the second electrode;
   a capacitor having a third electrode formed in a position overlapping the light emitting element and an insulating layer provided between the first electrode and the third electrode, the third electrode having a first side and a second side corresponding to the first side and the second side of the first electrode, respectively;
   a first drive transistor disposed on the first side of the first electrode and having a gate electrode connected to the first side of the third electrode; and
   a second drive transistor disposed on the second side of the first electrode and having a gate electrode connected to the second side of the third electrode,
   wherein the third electrode is provided with a protrusion on the first side thereof and is connected to the gate electrode of the first drive transistor at the protrusion, the protrusion extending outside of the first side of the first electrode, and
   wherein an opening is provided in the insulating layer at a position over the protrusion of the third electrode.

4. The light emitting device according to claim 3, further comprising an anode line connected to a drain electrode of the first drive transistor and a drain electrode of the second drive transistor.

5. The light emitting device according to claim 4, wherein the anode line is disposed on a third side of the first electrode differing from the first and second sides of the first electrode.

6. The light emitting device according to claim 3, wherein the third electrode is transparent to light emitted from the light emitting element.

7. The light emitting device according to claim 3, wherein the first electrode is transparent to light emitted from the light emitting element.

8. The light emitting device according to claim 3, wherein the gate electrode of the first drive transistor and the gate electrode of the second drive transistor are opaque to light emitted from the light emitting element.

9. The light emitting device according to claim 3, wherein the first drive transistor and the second drive transistor function as a single transistor.

10. The light emitting device according to claim 3, wherein the first and second drive transistors apply light emission drive current to the light emitting element.

11. The light emitting device according to claim 3, further comprising a first selection transistor of which one of a source electrode and a drain electrode is connected to the gate electrode of the first drive transistor and the gate electrode of the second drive transistor.

12. The light emitting device according to claim 3, further comprising:
   a data line; and
   a second selection transistor of which one of a source electrode and a drain electrode is connected to the data line.

13. The light emitting device according to claim 12, wherein the other of the source electrode and the drain electrode of the second selection transistor is connected to the first electrode.

14. An electronic device comprising the light emitting device according to claim 3.

15. The light emitting device according to claim 3, further comprising a line connected to the gate electrode of the first drive transistor at the opening of the insulating layer.

* * * * *